US010016785B2

(12) United States Patent
Orita et al.

(10) Patent No.: US 10,016,785 B2
(45) Date of Patent: Jul. 10, 2018

(54) OXIDE FILM DEPOSITION METHOD AND OXIDE FILM DEPOSITION DEVICE

(75) Inventors: Hiroyuki Orita, Tokyo (JP); Takahiro Shirahata, Tokyo (JP); Takahiro Hiramatsu, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 205 days.

(21) Appl. No.: 14/131,128

(22) PCT Filed: Sep. 13, 2011

(86) PCT No.: PCT/JP2011/070783
§ 371 (c)(1),
(2), (4) Date: Jan. 6, 2014

(87) PCT Pub. No.: WO2013/038484
PCT Pub. Date: Mar. 21, 2013

(65) Prior Publication Data
US 2014/0141170 A1    May 22, 2014

(51) Int. Cl.
*C23C 16/40*    (2006.01)
*B05D 3/04*    (2006.01)
(Continued)

(52) U.S. Cl.
CPC .............. *B05D 3/0453* (2013.01); *B05C 5/00* (2013.01); *B05D 3/0466* (2013.01); *C23C 16/18* (2013.01);
(Continued)

(58) Field of Classification Search
CPC . C23C 16/40–16/409; C23C 16/45514; C23C 16/45517;
(Continued)

(56) References Cited

U.S. PATENT DOCUMENTS 5,540,959 A * 7/1996 Wang .................. C23C 16/4486
427/248.1
6,235,112 B1 * 5/2001 Satoh .................. C23C 16/4408
117/102
(Continued)

FOREIGN PATENT DOCUMENTS

CN    103314134 A    9/2013
EP    2 431 330    3/2012
(Continued)

OTHER PUBLICATIONS

International Search Report dated Dec. 27, 2011 in PCT/JP11/070783 Filed Sep. 13, 2011.
(Continued)

*Primary Examiner* — Elizabeth A Burkhart
(74) *Attorney, Agent, or Firm* — Oblon, McClelland, Maier & Neustadt, L.L.P.

(57) ABSTRACT

The present invention provides a method for forming an oxide film by which normal formation of an oxide film is always achieved without receiving an influence of a change in the atmosphere, a metal oxide film having a low resistance can be formed, and a high efficiency of film formation is obtained. In the present invention, a raw material solution containing an alkyl compound is formed into a mist and ejected to a substrate (100) in the atmosphere. Additionally, an oxidizing agent that exerts an oxidizing effect on the alkyl compound is supplied to the mist of the raw material solution. Through the above-described processes, an oxide film is formed on the substrate in the present invention.

13 Claims, 3 Drawing Sheets

(51) Int. Cl.
*C23C 16/18* (2006.01)
*C23C 16/448* (2006.01)
*C23C 16/452* (2006.01)
*B05C 5/00* (2006.01)

(52) U.S. Cl.
CPC .......... *C23C 16/40* (2013.01); *C23C 16/4486* (2013.01); *C23C 16/452* (2013.01)

(58) Field of Classification Search
CPC .. C23C 16/45563–16/45578; C23C 16/45595; C23C 16/54–16/545; C23C 16/4486; B05C 5/00
USPC .... 118/715, 718; 427/248.1, 255.31–255.34, 427/255.26
See application file for complete search history.

(56) References Cited

U.S. PATENT DOCUMENTS

| | | | |
|---|---|---|---|
| 6,402,126 B2* | 6/2002 | Vaartstra | C23C 16/4486 118/708 |
| 9,096,441 B2 | 8/2015 | Inaba et al. | |
| 2003/0049384 A1* | 3/2003 | Liu | C03C 17/001 427/427 |
| 2004/0136891 A1 | 7/2004 | Kijima et al. | |
| 2005/0106435 A1* | 5/2005 | Jang | H01M 4/881 429/483 |
| 2005/0208215 A1* | 9/2005 | Eguchi | C23C 16/401 427/248.1 |
| 2006/0037539 A1* | 2/2006 | Toda | C23C 16/40 118/726 |
| 2006/0223328 A1 | 10/2006 | Utsunomiya et al. | |
| 2010/0105192 A1 | 4/2010 | Akae et al. | |
| 2011/0124204 A1 | 5/2011 | Ota et al. | |
| 2011/0143053 A1* | 6/2011 | Shirahata | C23C 16/407 427/576 |
| 2011/0151619 A1 | 6/2011 | Orita et al. | |
| 2011/0286151 A1 | 11/2011 | Saida | |
| 2012/0040083 A1 | 2/2012 | Orita et al. | |
| 2012/0094019 A1 | 4/2012 | Inaba et al. | |
| 2012/0112187 A1 | 5/2012 | Orita et al. | |
| 2013/0059451 A1 | 3/2013 | Akae et al. | |
| 2013/0247820 A1 | 9/2013 | Orita et al. | |

FOREIGN PATENT DOCUMENTS

| | | |
|---|---|---|
| JP | 01-301515 | 12/1989 |
| JP | 07-278817 | 10/1995 |
| JP | 2000-38671 A | 2/2000 |
| JP | 2006-193824 A | 7/2006 |
| JP | 2007-046155 | 2/2007 |
| JP | 2008-182183 | 8/2008 |
| JP | 2010-126402 | 6/2010 |
| TW | 200723368 A | 6/2007 |
| TW | 200731310 A | 8/2007 |
| TW | I290907 | 12/2007 |
| TW | 201030847 A1 | 8/2010 |
| TW | 201126607 A1 | 8/2011 |
| WO | 2010-035313 | 4/2010 |
| WO | WO 2010035312 * | 4/2010 |
| WO | WO 2010/131621 A1 | 11/2010 |

OTHER PUBLICATIONS

International Preliminary Report on Patentability and Written Opinion dated Mar. 27, 2014 in PCT/JP2011/070783 filed Sep. 13, 2011 with English language translation.

Taiwanese Search Report dated May 17, 2014 in Patent Application No. 100142866 (with partial English translation).

* cited by examiner

F I G. 1
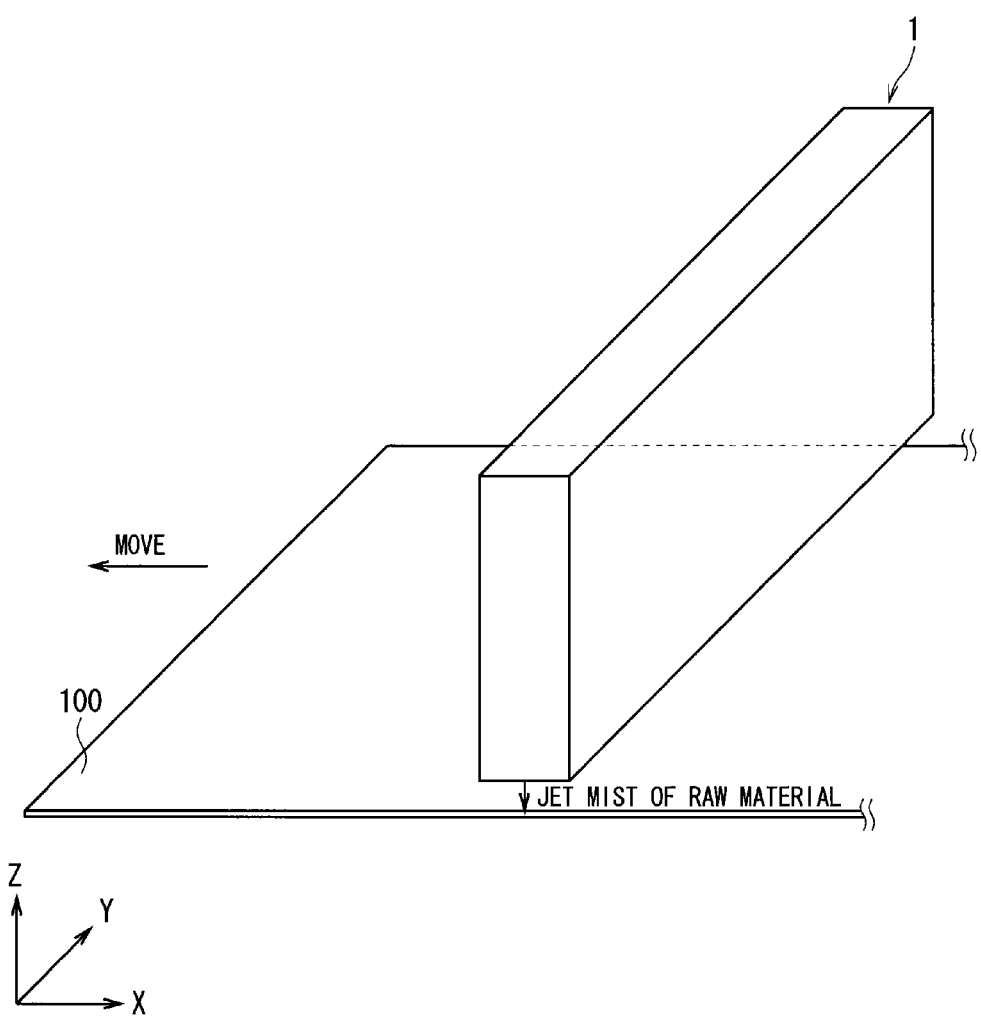

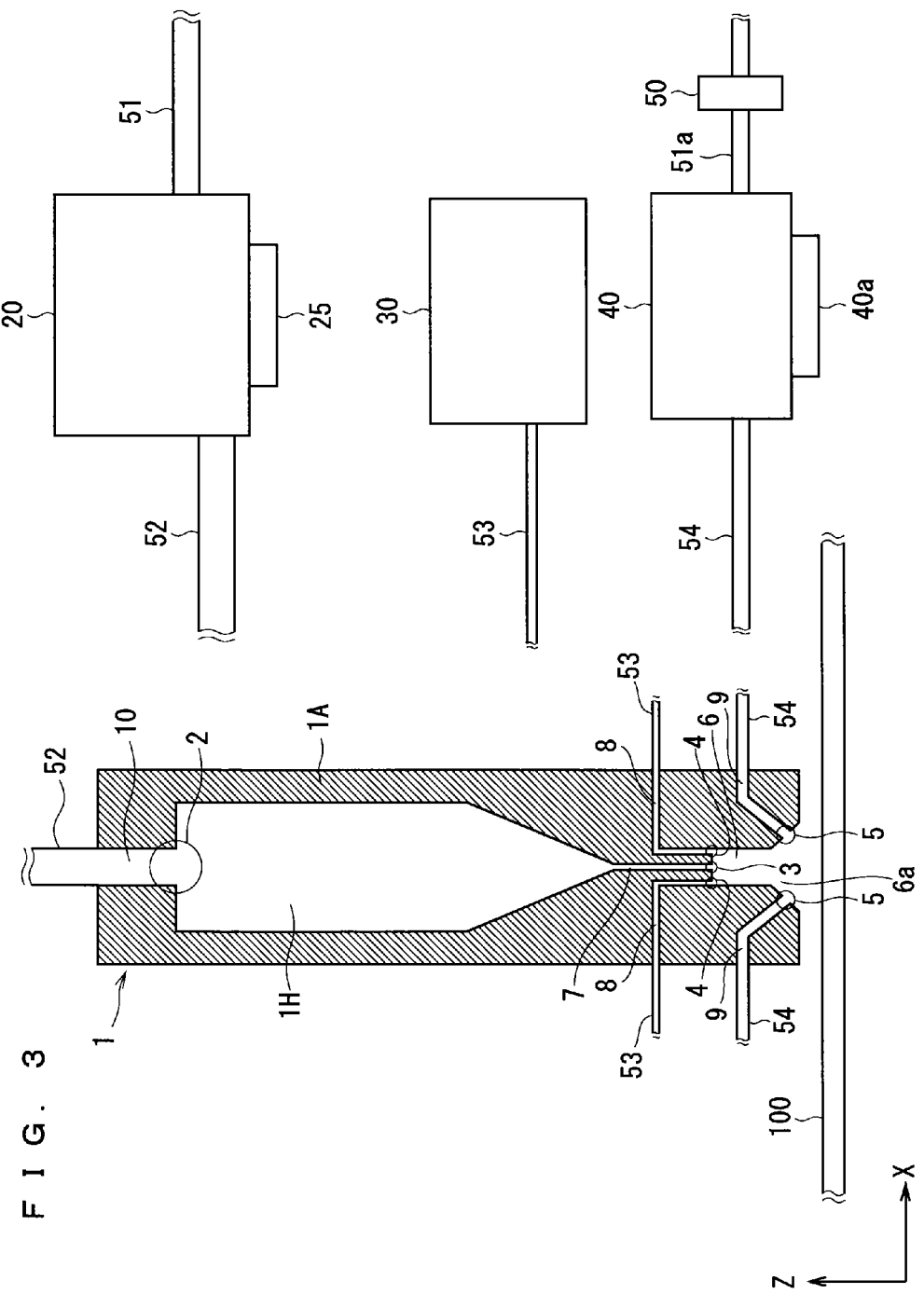

OXIDE FILM DEPOSITION METHOD AND OXIDE FILM DEPOSITION DEVICE

CROSS-REFERENCE TO RELATED APPLICATIONS

This application is a National Stage of PCT/JP2011/070783 filed on Sep. 13, 2011.

BACKGROUND OF THE INVENTION

Technical Field

The present invention relates to a method for forming an oxide film and an apparatus for forming an oxide film.

Background Art

An oxide film is a functional thin film that exerts various kinds of performance in accordance with a constituent element thereof (conductive properties, insulating properties, piezoelectric properties, magnetic properties, dielectric properties, superconductive properties), and, because of the diversity of its physical properties, applied to the fields of many electronic devices. For example, a zinc oxide thin film, which serves as a transparent conductive film having conductive properties, is used in a solar cell, an LED (Light Emitting Diode), a touch panel, or the like.

An example of a method for manufacturing the zinc oxide thin film is a chemical vapor deposition (CVD) process in which an organozinc compound is used as a raw material. In the chemical vapor deposition process, however, the film has to be formed under vacuum, which requires a large vacuum vessel in addition to a vacuum pump, and the like. Moreover, the chemical vapor deposition process involves a problem that a substrate with a large area is not adoptable as a substrate on which the film is to be formed from the viewpoint of costs, and the like.

An alkyl compound (for example, diethyl zinc), which is highly reactive, is ignitable in the atmosphere. Therefore, it is practically impossible that the alkyl compound is gasified and used in a film formation process which is performed in the atmosphere (gasifying a solution containing an alkyl compound causes liberation of an alkyl compound gas and a gas resulting from a solvent from each other, so that the alkyl compound gas is directly in contact with the atmosphere to cause ignition or the like). Accordingly, to form, for example, a zinc oxide thin film in the atmosphere, it is necessary that a solution of, for example diethyl zinc dissolved in a solvent is used in the liquid state.

In view of the problems described above, for example, Patent Document 1 may be mentioned as a related art document that discloses a method for forming a zinc oxide thin film on a substrate.

In the method for forming a zinc oxide thin film disclosed in the Patent Document 1, a solution in which an organozinc compound is dissolved in an organic solvent is applied by spraying to a substrate surface in the atmosphere (an atmosphere where water is present). The size of each droplet adopted in this spray application is in a range of 1 to 30 µm.

The technique of the Patent Document 1 includes a film formation process in the atmosphere, and therefore does not require a vacuum pump, a vacuum chamber, and devices such as a pressure meter, which can considerably reduce the apparatus cost and the manufacturing cost as compared with the chemical vapor deposition process. Additionally, the technique of the Patent Document 1 does not require the use of a vacuum vessel, and therefore restrictions that the vacuum vessel would apply are not caused (a vacuum vessel with a large capacity is at a high cost from the viewpoint of the airtightness and the like). Therefore, it is possible to prepare a zinc oxide thin film on a substrate with a large area.

Furthermore, the technique of the Patent Document 1 does not employ the method in which diethyl zinc or the like is gasified and a substrate arranged in the atmosphere is exposed to the gasified diethyl zinc or the like, but employs a method in which a raw material solution containing diethyl zinc is sprayed to a substrate. As a result, a situation where gaseous diethyl zinc is present in the atmosphere during a film formation process does not occur, and therefore the problem of ignition and the like does not occur, either.

PRIOR-ART DOCUMENTS

Patent Documents

Patent Document 1: Japanese Patent Application Laid-Open No. 2010-126402

SUMMARY OF THE INVENTION

Problems to be Solved by the Invention

As described above, the technique of the Patent Document 1 forms a zinc oxide thin film by a solution in which diethyl zinc is dissolved is applied by spraying to a substrate in an atmosphere where water is present. That is, the technique of the Patent Document 1 causes the sprayed raw material solution to react with moisture contained in the atmosphere where the substrate is placed, to thereby form a zinc oxide thin film.

However, the atmosphere in which the film formation is implemented is largely influenced by the temperature and humidity. The amount of moisture contained in the atmosphere changes depending on the humidity and temperature of the surroundings, and the like, and thus cannot be controlled properly. Therefore, the technique of the Patent Document 1 may sometimes fail to form a zinc oxide thin film because of a change in the humidity and temperature of the surroundings, and the like. Even though a zinc oxide thin film is formed; due to a change in the humidity and temperature of the surroundings, and the like, it is difficult to stably form a zinc oxide thin film having a desired performance (for example, conductive properties, crystalline properties, permeation properties, a film density, and a surface shape) with a good reproductivity (particularly a problem that the resistance cannot be lowered arises), and moreover the speed of film formation is also influenced.

In the technique of the Patent Document 1, the sprayed raw material solution is caused to react with moisture contained in the atmosphere where the substrate is arranged. This involves a problem that the efficiency of film formation relative to the amount of supply of the raw material solution is poor (that is, a larger amount of the raw material solution needs to be sprayed to the substrate in order that a formed film has a desired film thickness).

Therefore, an object of the present invention is to provide an oxide film formation method and an oxide film formation apparatus by which an oxide film having a desired performance can be always stably formed without receiving an influence of a change in the atmosphere, with a good reproductivity, and with a good efficiency of film formation.

Means for Solving the Problems

To attain the object, an oxide film formation method according to the present invention is an oxide film formation method for forming an oxide film on a substrate, the method including performing: (A) a raw material mist ejection process for forming a raw material solution containing an alkyl compound into a mist and ejecting the mist to the substrate in the atmosphere; and (B) an oxidizing agent supply process for supplying an oxidizing agent that exerts an oxidizing effect on the alkyl compound to the mist of the raw material solution that has been ejected to the substrate through the raw material mist ejection process.

An oxide film formation apparatus according to the present invention is an oxide film formation apparatus for forming an oxide film on a substrate, the apparatus including: a raw material mist ejection port configured to eject a misty raw material solution containing an alkyl compound to the substrate arranged in the atmosphere; and an oxidizing agent supply port configured to supply an oxidizing agent that exerts an oxidizing effect on the alkyl compound to the mist of the raw material solution that has been ejected from the raw material mist ejection port to said substrate.

Effects of the Invention

In the present invention, a raw material solution containing an alkyl compound is formed into a mist and then ejected to a substrate in the atmosphere. Then, an oxidizing agent that exerts an oxidizing effect on the alkyl compound is supplied to the mist of the raw material solution.

Accordingly, in the present invention, the mist of the raw material can be positively exposed to a sufficient amount of oxidizing agent in addition to the moisture, and the like, contained in the atmosphere. Therefore, in a case of forming an oxide film by using the mist method, formation of the oxide film can be surely achieved, the speed of formation of the oxide film (the efficiency of film formation) can be improved, and the oxide film having a desired performance can be stably prepared with a good reproducibility.

Additionally, in the present invention, in addition to the moisture, and the like, contained in the atmosphere, the oxidizing agent can be positively and sufficiently supplied to the mist of the raw material. Therefore, even when, for example, the amount of moisture contained in the atmosphere is changed due to an influence of the temperature and humidity, the oxide film can be formed on the upper surface of the substrate with almost no influence given from the change in the moisture (that is, normal formation of the oxide film is always achieved in the atmosphere).

These and other objects, features, aspects and advantages of the present invention will become more apparent from the following detailed description of the present invention when taken in conjunction with the accompanying drawings.

BRIEF DESCRIPTION OF THE DRAWINGS

FIG. 1A perspective view showing a configuration of an external appearance of a mist jet nozzle 1 according to an embodiment of the present invention.

FIG. 3 A cross-sectional view showing a configuration of an apparatus for forming an oxide film according to the embodiment of the present invention and an internal configuration of the mist jet nozzle 1.

EMBODIMENT FOR CARRYING OUT THE INVENTION

Figure 2:
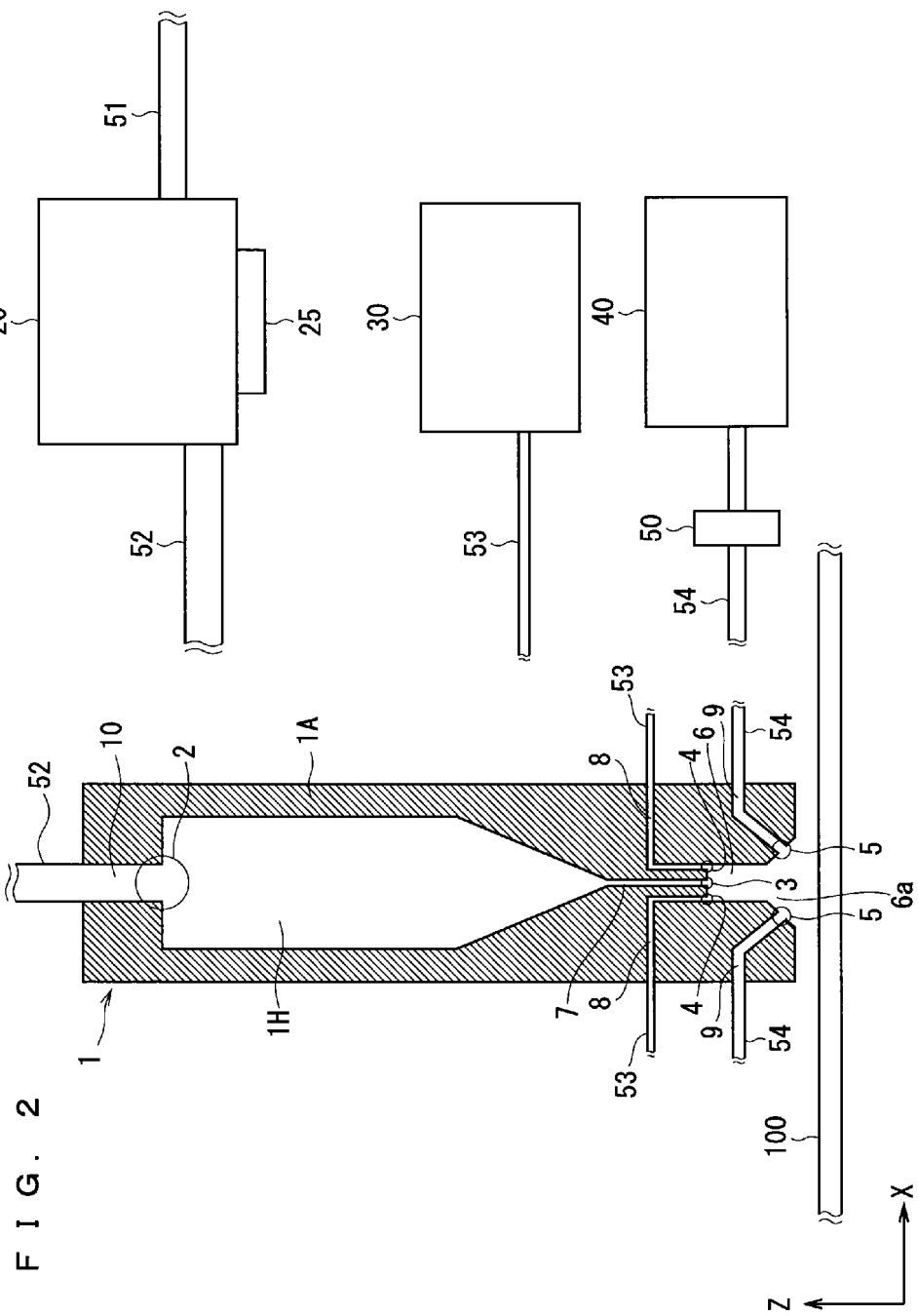
FIG. 2 A cross-sectional view showing a configuration of an apparatus for forming an oxide film according to the embodiment of the present invention and an internal configuration of the mist jet nozzle 1.

The present invention relates to a method and an apparatus for forming, in the atmosphere, an oxide film on a substrate arranged in the atmosphere by jetting a mist of a raw material of the oxide film to the substrate. In the present invention, the mist of the raw material is obtained by forming a raw material solution, in which an alkyl compound that is highly reactive is dissolved in a solvent, into a mist by using an ultrasonic atomizer. Thus, the mist of the raw material can be regarded as the raw material solution being in a mist state.

The present invention does not employ a method in which a substrate is exposed to an alkyl compound gas in a gasified state to thereby form an oxide film on the substrate, but employs a method in which a "mist" of the raw material solution is sprayed to a substrate to thereby form an oxide film on the substrate.

In the specification herein, the term "mist" means the raw material solution that is atomized by an ultrasonic atomizer such that the diameter of each droplet is 10 μm or less. Setting the upper limit of the droplet diameter to be 10 μm can prevent a temperature drop in the substrate which may otherwise occur due to the droplets having a heat capacity.

No particular limitation needs to be put on the lower limit of the particle diameter of the "mist", as long as the raw material solution is not in a gas state but in a liquid state. An illustrative example of the lower limit of the "mist" is about 0.1 μm.

Since the ultrasonic atomizer atomizes the raw material solution, the size of the mist droplet can be set to a small value as mentioned above, and thus a falling speed in which the ejected mist of the raw material reaches the substrate can be sufficiently lowered (that is, it can be expected that the mist of the raw material reacts like a gas). Since the mist droplet has a small size of 10 μm or less, a reaction of the oxide film on the substrate is quickly caused.

In the spraying method, an inert gas is used to prepare droplets and the droplets as well as the inert gas are ejected toward the substrate. In the present invention, in contrast, the raw material solution is atomized (a mist of the raw material is prepared) by using an ultrasonic atomizer, and an inert gas is used as a carrier gas for the mist of the raw material. Accordingly, while the spraying method faces a difficulty in adjusting the speed of jetting of the droplets, the mist method adopted in the present invention can adjust the speed of ejection of the mist of the raw material merely by adjusting the flow rate of the inert gas.

Moreover, the spraying method uses the inert gas so that droplets each having a size of about several tens of μm are prepared from the raw material solution, as mentioned above. This requires a large amount of the inert gas to be supplied. Supplying a large amount of the inert gas increases the falling speed of the droplets, which causes the droplets to collide with the substrate at a high speed. This causes problems that, for example, the droplets scatter on the substrate and the droplets are left unreacted on the substrate.

The mist method uses the ultrasonic atomizer to atomize the raw material solution (to prepare the mist of the raw material), and uses an inert gas as a carrier gas for the mist of the raw material. The inert gas does not contribute to preparation of the droplets. Therefore, it is not necessary to supply a large amount of the inert gas. Thus, the problems of the spraying method are solved by the mist method adopted in the present invention (the flow rate of the inert gas is freely adjustable in accordance with the speed of ejection of the mist of the raw material).

The method for forming an oxide film disclosed in the above-described Patent Document 1 which adopts the spraying method has been implemented by the inventors with use of the mist method instead of the spraying method. As a result of this implementation, a case has occurred in which formation of an oxide film was not achieved. Additionally, the inventors have found out the following as a result of this implementation. Even in a case where formation of an oxide film was achieved, the speed of formation of the oxide film (the efficiency of film formation) was low, and the resistance cannot be sufficiently reduced in a case of preparing an oxide film having conductive properties.

Moreover, the inventors have conducted a lot of examinations, experiments, and the like, to result in the following findings. That is, in a case of forming an oxide film by using the mist method, an atmosphere having a relative humidity as disclosed in the Patent Document 1 is not suitable as the environment of film formation, because an influence of the temperature and the humidity is large.

Furthermore, the inventors have found out that, in a case of forming an oxide film by using the mist method, the following is necessary in order to surely achieve formation of an oxide film, improve the speed of formation of an oxide film (the efficiency of film formation), and prepare an oxide film having a high conductivity. That is, the inventors have also found out that it is desirable that: an oxidizing agent should be positively supplied to the ejected mist raw material in addition to an oxidizing agent contained in the atmosphere (in other words, the amount of moisture (which is considered to be the oxidizing agent) contained in the atmosphere having a relative humidity of about 90% is not sufficient for causing a reaction with the mist of the raw material to form an oxide film); and the amount of the supplied oxidizing agent should be adjusted.

In the following, a specific description will be given to the present invention with reference to the drawings which illustrates an embodiment of the present invention.

Embodiment

FIG. 1 is a perspective view showing a configuration of an external appearance of a mist jet nozzle 1 included in an apparatus for forming an oxide film according to an embodiment. FIG. 1 shows coordinate axes X-Y-Z, too. FIG. 2 is a cross-sectional view showing an outline configuration of the whole of the apparatus for forming an oxide film. FIG. 2 shows a cross-section of the configuration shown in FIG. 1 as seen along the Y direction.

For simplification of the drawing, FIG. 1 does not show chambers 20, 30, 40, pipes 51, 52, 53, 54, an ultrasonic atomizer 25, and a supply adjustment unit 50, which are shown in FIG. 2. In FIG. 1, for simplification of the drawing, an internal configuration of the mist jet nozzle 1 is not illustrated, either. FIG. 2 shows an X-Z coordinate system, too. In FIG. 2, for illustrating the internal configuration of the mist jet nozzle 1, the mist jet nozzle 1 is illustrated with an enlarged size relative to the sizes of the chambers 20, 30, and 40.

In an exemplary configuration shown in FIG. 1, to form a thin oxide film on a substrate 100 having a rectangular shape with a length equal to or larger than 1 m on a side, the mist jet nozzle 1 is positioned above the substrate 100. The mist jet nozzle 1 jets a mist of a raw material, which is a raw material of a film to be formed, to an upper surface of the substrate 100. While performing the jetting, for example, the substrate 100 is moved in a horizontal direction (X direction). Jetting the mist with such movement enables the mist of the raw material to be jetted to the entire surface of the upper surface of the substrate 100. As a result, a uniform thin oxide film can be formed on the entire surface of the upper surface of the substrate 100.

The substrate 100 may be either heated or unheated (that is, the film formation can be performed at an ordinary temperature). The distance between the upper surface of the substrate 100 and an end portion of the mist jet nozzle 1 during the mist jetting, for example, about several mm.

The substrate 100 is arranged in the atmosphere, and the mist jet nozzle 1 is also placed in the atmosphere during a film formation process.

As shown in FIG. 2, the apparatus for forming an oxide film includes the mist jet nozzle 1, the chambers 20, 30, 40, the pipes 51, 52, 53, 54, the ultrasonic atomizer 25, and the supply adjustment unit 50.

As shown in FIG. 2, the mist jet nozzle 1 includes a main body 1A having a hollow part 1H. As shown in FIGS. 1 and 2, the main body 1A has, in its outline external appearance, a substantially rectangular parallelepiped shape with a short width in the X direction (for example, about several cm), a long depth in the Y direction (which is slightly longer than the diameter of the substrate 100 in the Y direction; for example, 1 m or longer), and a slightly large height in the Z direction (for example, about 10 to 20 cm).

The main body 1A may be made of, for example, stainless steel, but from the viewpoint of a weight reduction, aluminum is adoptable. In a case of adopting aluminum, it is desirable to apply coating, in order to improve a corrosion resistance of the main body 1A.

As shown in FIG. 2, the main body 1A is provided with a raw material mist supply port 2, a raw material mist ejection port 3, inert gas ejection ports 4, and oxidizing agent supply ports 5. The main body 1A is also provided with a raw material mist supply passage 10, a raw material mist passage 7, inert gas passages 8, and oxidizing agent passages 9. As shown in FIG. 2, the width of the hollow part 1H in the X direction is smoothly narrowed toward the raw material mist ejection port 3 (raw material mist passage 7).

The raw material mist supply port 2 is provided in an upper portion of the hollow part 1H, and connect the raw material mist supply passage 10 to the hollow part 1H. The raw material mist supply port 2 may be provided in a side surface of the hollow part 1H. A mist of a raw material generated in a raw material mist generation chamber 20 is supplied into the hollow part 1H of the main body 1A through the pipe 52, the raw material mist supply passage 10, and the raw material mist supply port 2.

A lower side of the hollow part 1H is connected to one end of the raw material mist passage 7. The other end of the raw material mist passage 7 is connected to the raw material mist ejection port 3. As shown in FIG. 2, the raw material mist ejection port 3 is provided in a portion of the main body 1A at a position slightly recessed in the Z direction relative to the lower end of the mist jet nozzle 1.

The raw material mist ejection port 3 is formed in a surface of the main body 1A such that the raw material mist ejection port 3 faces the upper surface (where a thin film is to be formed) of the substrate 100 during the mist jetting. The mist of the raw material, which is spread in the hollow part 1H, goes through the raw material mist passage 7, and is ejected (jetted) from the raw material mist ejection port 3 toward the substrate 100.

As shown in FIG. 2, the inert gas ejection port 4 is formed in a portion of the main body 1A that neighbors the raw material mist ejection port 3 with interposition of a thin portion of the main body 1A. In an exemplary configuration shown in FIG. 2, two inert gas ejection ports 4 are provided in the mist jet nozzle 1, and the raw material mist ejection port 3 is arranged between the two inert gas ejection ports 4 (that is, the ejection ports 3 and 4 are provided such that one inert gas ejection port 4, the main body 1A, the raw material mist ejection port 3, the main body 1A, and the other inert gas ejection port 4 are arranged in this order with respect to the X direction, as shown in FIG. 2).

Two inert gas passages 8 are formed in the main body 1A such that each of them corresponds to each of the inert gas ejection ports 4. One end of each inert gas passage 8 is connected to the pipe 53, and the other end of each inert gas passage 8 is connected to each of the inert gas ejection ports 4.

As shown in FIG. 2, similarly to the raw material mist ejection port 3, the inert gas ejection ports 4 are also provided in portions of the main body 1A at positions slightly recessed in the Z direction relative to the lower end of the mist jet nozzle 1. In the exemplary configuration shown in FIG. 2, the inert gas ejection ports 4 and the raw material mist ejection port 3 are drilled in the main body 1A such that they are almost at the same height with respect to the Z direction.

The inert gas ejection ports 4 are formed in the surface of the main body 1A such that the inert gas ejection ports 4 are directed to the upper surface of the substrate 100 during the mist jetting. An inert gas supplied from the inert gas chamber 30 is, through the inert gas passages 8, ejected (jetted) from the inert gas ejection ports 4 toward the substrate 100.

The inert gas ejection ports 4 are formed in the main body 1A in such a manner that the inert gas ejected from the inert gas ejection ports 4 purges a surrounding area of the jetted mist of the raw material near the raw material mist ejection port 3. More specifically, the inert gas ejection ports 4 neighbor the raw material mist ejection port 3, and an opening surface of each of the inert gas ejection ports 4 is directed to the upper surface of the substrate 100 to make it possible to purge a surrounding area of the mist of the raw material ejected from the raw material mist ejection port 3.

As apparent from the description given above and the configuration shown in FIG. 2, a system for ejecting the inert gas is different from a system for ejecting the mist of the raw material.

Each of the openings of the raw material mist ejection port 3 and the inert gas ejection ports 4 has a slit-like shape elongated in the Y direction.

As shown in FIG. 2, the main body 1A has a cavity 6 whose cross-section widens in the X direction toward the lower end of the mist jet nozzle 1. The oxidizing agent supply ports 5 are formed in inclined surfaces of the cavity 6. In the exemplary configuration shown in FIG. 2, two oxidizing agent supply ports 5 are provided, and each of the oxidizing agent supply ports 5 is drilled in the main body 1A such that the oxidizing agent supply port 5 corresponds to each of the inclined surfaces.

Two oxidizing agent passages 9 are formed in the main body 1A such that each of them corresponds to each of the oxidizing agent supply ports 5. One end of each oxidizing agent passage 9 is connected to the pipe 54, and the other end of each oxidizing agent passage 9 is connected to each of the oxidizing agent supply ports 5.

As shown in FIG. 2, the oxidizing agent supply ports 5 are provided in portions of the main body 1A at positions slightly recessed in the Z direction relative to the lower end of the mist jet nozzle 1. In the exemplary configuration shown in FIG. 2, the positions where the oxidizing agent supply ports 5 are formed are closer to the substrate 100 (closer to the lower end of the mist jet nozzle 1) than the positions where the inert gas ejection ports 4 and the raw material mist ejection port 3 are formed.

The oxidizing agent supply ports 5 are formed in a surface of the main body 1A such that the oxidizing agent supply ports 5 face the upper surface of the substrate 100 and the mist of the raw material jetted toward the substrate 100 during the mist jetting. An oxidizing agent supplied from the oxidizing agent chamber 40 is, through the oxidizing agent passages 9, supplied toward the mist of the raw material ejected from the raw material mist ejection port 3.

The oxidizing agent supply ports 5 are formed in the main body 1A in such a manner that the oxidizing agent outputted from the oxidizing agent supply port 5 is, from right and left in the X direction, mixed with the jetted mist of the raw material in a mixing region (a region whose cross-section widens toward the substrate 100; a predetermined region in the cavity 6 that faces the substrate 100) 6a, which is a part of the cavity 6 near the upper surface of the substrate 100.

The width of the mixing region 6a in the X direction is set wider than that of a region of the cavity 6 (in the exemplary configuration shown in FIG. 2, a region of the cavity 6 whose cross-section has a rectangular shape) other than the mixing region 6a. In this wide region, the mist of the raw material is mixed with the oxidizing agent, as will be described later.

As apparent from the description given above and the configuration shown in FIG. 2, a system for ejecting the oxidizing agent is different from the system for ejecting the mist of the raw material.

The opening of the oxidizing agent supply port 5 has a slit-like shape elongated in the Y direction.

The apparatus for forming an oxide film also includes the raw material mist generation chamber 20. The raw material mist generation chamber 20 contains therein a raw material solution containing an alkyl compound. The ultrasonic atomizer 25 is placed in the raw material mist generation chamber 20. In the raw material mist generation chamber 20, the raw material solution is formed into a mist through an ultrasonic atomizing process with use of an ultrasonic atomizer (that is, the ultrasonic atomizer 25 generates the mist of the raw material from the raw material solution, which can be considered as a mist generation process).

The alkyl compound serving as a solute of the raw material solution is any of diethyl zinc, dimethyl zinc, dimethyl magnesium, diethyl magnesium, biscyclopentadienyl magnesium, trimethyl aluminum, triethyl aluminum, trimethyl gallium, triethyl gallium, trimethyl indium, triethyl indium, tetramethyl silane, tetraethyl silane, trimethyl silane, triethyl silane, dimethyl silane, and diethyl silane.

As a solvent of the raw material solution, amine-based solvents based on trimethyl amine, triethyl amine, triphenyl amine, and the like, and ether-based solvents based on diethyl ether, di-n-propyl ether, diisopropyl ether, dibutyl ether, tetrahydrofuran, dioxane, glyme, diglyme, triglyme, and the like, are adoptable. Alternatively, carbon hydride, alcohol, and the like, are also adoptable as a solvent of the raw material solution.

The mist of the raw material generated in the raw material mist generation chamber 20 is carried on a carrier gas that is supplied from the pipe 51, and outputted to the pipe 52. The mist of the raw material passes through the pipe 52 and the raw material mist supply passage 10, and is supplied from the raw material mist supply port 2 into the hollow part 1H of the mist jet nozzle 1. For example, nitrogen and a rare gas are adoptable as the carrier gas.

The mist of the raw material having spread in the hollow part 1H passes through the raw material mist passage 7, and ejected (jetted) from the raw material mist ejection port 3 toward the upper surface of the substrate 100 (which can be considered as a raw material mist ejection process).

The flow rate of the mist of the raw material ejected from the raw material mist ejection port 3 can be adjusted by adjustment of the flow rate of the carrier gas supplied from the pipe 51.

The apparatus for forming an oxide film also includes the inert gas chamber 30. The inert gas chamber 30 contains therein an inert gas. Nitrogen or a rare gas is adoptable as the inert gas.

The inert gas in the inert gas chamber 30 is outputted to the pipe 53 at a predetermined flow rate. Then, the inert gas passes through the pipe 53 and the inert gas passages 8, and is ejected (jetted) from the inert gas ejection ports 4. The inert gas ejected from the inert gas ejection ports 4 is sprayed (ejected) to the surrounding area of the mist of the raw material near the raw material mist ejection port 3, and then, together with the mist of the raw material, goes toward the upper surface of the substrate 100 (which can be considered as an inert gas ejection process).

The apparatus for forming an oxide film also includes the oxidizing agent chamber 40. The oxidizing agent chamber 40 contains therein an oxidizing agent that exerts an oxidizing effect on the alkyl compound contained in the raw material solution.

As the oxidizing agent that exerts an oxidizing effect on the alkyl compound, any of water, oxygen, hydrogen peroxide, ozone, nitric oxide, nitrous oxide, and nitrogen dioxide is adoptable. The oxidizing agent may be either in a liquid state or in a gas state.

The oxidizing agent in the oxidizing agent chamber 40 is outputted to the pipe 54. Then, the oxidizing agent passes through the pipe 54 and the oxidizing agent passages 9, and is outputted from the oxidizing agent supply ports 5 to the mixing region 6a of the cavity 6 of the mist jet nozzle 1 in a spotted manner and in a positive manner (that is, an oxidizing agent is supplied in addition to an oxidizing agent contained in the atmosphere). The oxidizing agent outputted from the oxidizing agent supply ports 5 is mixed with (supplied to) the mist of the raw material in the mixing region 6a located at the lower end of the mist jet nozzle 1 which is near the substrate 100, and then, together with the mist of the raw material, goes toward the upper surface of the substrate 100 (which can be considered as an oxidizing agent supply process).

In the mixing region 6a near the upper surface of the substrate 100, the mist of the raw material and the oxidizing agent cause an oxidizing action, so that a predetermined oxide film (an oxide film with conductive properties or an oxide film with insulating properties) in accordance with the type of the alkyl compound is formed on the upper surface of the substrate 100.

The supply adjustment unit 50, for example, a mass flow controller is provided in the pipe 54. The supply adjustment unit 50 is able to adjust the flow rate of the oxidizing agent flowing through the pipe 54 to be any desired constant value.

A configuration in which the supply adjustment unit 50 is provided in the pipe 54 is applied in a case where the oxidizing agent supplied from the oxidizing agent supply port 5 is in a gas state. For example, in a case where the oxidizing agent supplied from the oxidizing agent supply port 5 is in a liquid state, a configuration shown in FIG. 3 is adopted.

In an exemplary configuration shown in FIG. 3 for supplying a liquid oxidizing agent, a liquid oxidizing agent in the chamber 50 is formed into a mist by an ultrasonic atomizer 40a. Then, the misted oxidizing agent is carried on a carrier gas that is supplied from a pipe 51a, and outputted to the pipe 54. As shown in the configuration of FIG. 3, in a case where the supplied oxidizing agent is in a liquid state, the supply adjustment unit 50 such as a mass flow controller is provided in the pipe 51a that is a passage for supplying the carrier gas. The supply adjustment unit 50 adjusts the flow rate of the carrier gas flowing through the pipe 51a to be any desired constant value, and thereby can adjust the flow rate of the misted oxidizing agent flowing through the pipe 54 to be any desired constant value.

As described above, the supply adjustment unit 50 is able to adjust the amount of the oxidizing agent (in a liquid state or in a gas state) supplied to the mist of the raw material to be a desired constant value. The amount of supply of the oxidizing agent is determined in accordance with the type of the mist of the raw material, the type of the oxidizing agent, and the flow rate of the mist of the raw material.

For example, in a case where the supply flow rate of the oxidizing agent is adjusted to be a supply flow rate 11 by using the supply adjustment unit 50; after the adjustment, the oxidizing agent with the supply flow rate 11 is steadily outputted from the oxidizing agent supply port 5. In a case where the supply flow rate of the oxidizing agent is adjusted to be a supply flow rate 12 by using the supply adjustment unit 50 in accordance with the type of the alkyl compound; after the adjustment, the oxidizing agent with the supply flow rate 12 is steadily outputted from the oxidizing agent supply port 5.

As shown in FIG. 2, a portion of the main body 1A is notched from the lower end of the mist jet nozzle 1, and thereby the cavity 6 is formed within the main body 1A. Inside the main body 1A, the raw material mist ejection port 3, the inert gas ejection ports 4, and the oxidizing agent supply ports 5 are formed so as to face the cavity 6. The mixing region 6a having a large capacity is provided at the substrate 100 side of the cavity 6. Thus, all of the raw material mist ejection port 3, the inert gas ejection ports 4, the oxidizing agent supply ports 5, and the mixing region 6a are provided in the cavity 6 that is formed by notching a portion of the lower end of the mist jet nozzle 1, and these parts 3, 4, 5, and 6a are formed inside the main body 1A.

As described above, in this embodiment, the mist of the raw material containing the alkyl compound is ejected toward the substrate 100 in the atmosphere. Additionally, the oxidizing agent that exerts an oxidizing effect on the alkyl compound is positively supplied in a spotted manner to the mist of the raw material ejected toward the substrate 100. As seen from the description given above, the supply of the oxidizing agent to the mist of the raw material is implemented in the mixing region 6a of the cavity 6 that is near the upper surface of the substrate 100.

Accordingly, in this embodiment, the mist of the raw material can be positively exposed to a sufficient amount of oxidizing agent in addition to the moisture, and the like, contained in the atmosphere. Therefore, in a case of forming an oxide film by using the mist method, formation of the oxide film can be surely achieved, the speed of formation of the oxide film (the efficiency of film formation) can be improved, and the oxide film having a desired performance can be stably formed with a good reproductivity.

In this embodiment, as described above, in addition to the moisture, and the like, contained in the atmosphere, the oxidizing agent can be positively and sufficiently supplied to the mist of the raw material. Therefore, even when, for example, the amount of moisture contained in the atmosphere is changed due to an influence of the temperature and humidity, the oxide film can be formed on the upper surface of the substrate 100 with almost no influence given from the change in the moisture (that is, normal formation of the oxide film is always achieved in the atmosphere).

Formation of a zinc oxide thin film (a zinc oxide thin film having conductive properties as a transparent conductive film) on a substrate was attempted by using the mist method. This attempt was made in a case where a predetermined amount of oxidizing agent was positively supplied to the mist of the raw material (the former case) and a case where an oxidizing agent was not positively supplied and only moisture contained in the atmosphere was caused to react with the mist of the raw material (the latter case). Diethyl zinc was adopted as the alkyl compound contained in the mist of the raw material, and a mist of water was adopted as the oxidizing agent. The amount of supply of the mist of the raw material, and a time period of the film formation process were the same in both cases.

In the latter case, only moisture contained in the atmosphere served as the oxidizing agent. Therefore, it is necessary that the mist of the raw material that was ejected was in contact with the atmosphere as much as possible. Accordingly, in the latter case, the distance from the lower end of the jet nozzle for jetting the mist of the raw material to the substrate needed to be about several cm (in the former case, the distance from the lower end of the mist jet nozzle 1 to the substrate 100 was about several mm as described above).

As a result, the film thickness of the zinc oxide film formed in the former case was about five times larger than the film thickness of the zinc oxide film formed in the latter case. Based on the consideration that the time period of the film formation process and the amount of supply of the raw material gas and the like were the same, this result indicates that the speed of formation of the oxide film (the efficiency of film formation) was improved in the former case as compared with in the latter case.

In an example of film formation in the former case, diethyl zinc was adopted as the alkyl compound and water was adopted as the oxidizing agent. Many of alkyl compounds are highly susceptible to oxidation, and readily react with moisture in the air due to their molecular structure. Therefore, it could be concluded that, similarly to diethyl zinc, other alkyl compounds different from diethyl zinc also enable an oxide film having a desired performance to be efficiency and stably formed with a good reproducibility when an oxidizing agent is positively supplied. As described above, the inventors have found out that, to form an oxide film by using an alkyl compound as a raw material, an oxidizing agent contained in the atmosphere is not sufficient, and it is necessary that an oxidizing agent that exerts an oxidizing effect on an alkyl compound is positively supplied, from the viewpoint of improvement in the efficiency of film formation and stable formation of an oxide film having a desired performance. Although water (water vapor) was adopted as the oxidizing agent in the example of film formation in the former case, oxygen, hydrogen peroxide, ozone, nitric oxide, nitrous oxide, nitrogen dioxide, and the like, are also adoptable as long as it is an oxidizing agent that exerts an oxidizing effect on an alkyl compound. The oxidizing agent may be either in a liquid or in a gas state.

The sheet resistance of the zinc oxide film formed in the former case was about $1/250$ of the sheet resistance of the zinc oxide film formed in the latter case. This indicates that the resistance of the oxide film was lower in the former case than in the latter case.

As shown in FIG. 2, the oxidizing agent supply ports 5 are formed not near the raw material mist ejection port 3 but near the lower end of the mist jet nozzle 1 which is closer to the substrate 100. This configuration enables the reaction caused by mixing of the mist of the raw material and the oxidizing agent to occur near the substrate 100, not near the raw material mist ejection port 3. Accordingly, adhering of a reaction product generated as a result of a reaction between the mist of the raw material and the oxidizing agent can be suppressed in the raw material mist ejection port 3. This can consequently suppress clogging of the raw material mist ejection port 3.

Also from the viewpoint of the efficiency of formation of the oxide film on the substrate 100, it is desirable that the oxidizing agent supply ports 5 are formed not near the raw material mist ejection port 3 but near the lower end of the mist jet nozzle 1 which is closer to the substrate 100.

As shown in FIG. 2, the mixing region 6a of the cavity 6 has its cross-section widening toward the lower end of the mist jet nozzle 1, so that a relatively large capacity is ensured at the lower end side of the main body 1A. Accordingly, the reaction of the mist of the raw material and the oxidizing agent occurs in the mixing region 6a having the relatively large capacity. Thus, a bad influence of, for example, clogging due to adhering of a reaction product is not caused in the mixing region 6a.

In the configuration shown in FIG. 2, the configurations 30, 53, 8, and 4, which contribute to the inert gas ejection process, may be omitted. However, as described above, it is desirable to provide the inert gas ejection ports 4 near the raw material mist ejection port 3 and provide the configurations 30, 53, 8, and 4 that enable an inert gas to be sprayed to the surrounding area of the ejected mist of the raw material.

Providing the configurations 30, 53, 8, and 4 that enable the inert gas ejection process can prevent occurrence of a contact of the mist of the raw material ejected from raw material mist ejection port 3 with a substance (moisture contained in the atmosphere) that is other than the oxidizing agent outputted from the oxidizing agent supply ports 5 and that contributes to a reaction in a surrounding atmosphere. Therefore, in the raw material mist ejection port 3, occurrence of a reaction of the mist of the raw material and the substance that contributes to the reaction in the surrounding atmosphere can be prevented. As a result, adhering of a reaction product in the raw material mist ejection port 3 can be prevented. Thus, clogging of the raw material mist ejection port 3 does not occur.

From the viewpoint of preventing adhering of a reaction product in the raw material mist ejection port 3, the inert gas supply ports 4 are formed not near the lower end of the mist jet nozzle 1 which is closer to the substrate 100, but near the raw material mist ejection port 3.

In order that the inert gas ejected from the inert gas ejection ports 4 can be sprayed also to the mist of the raw material, the opening surfaces of the inert gas ejection ports 4 may be directed toward the ejected mist of the raw material (including the surroundings of the raw material mist ejection port 3).

In a case where the configurations 30, 53, 8, and 4 that contribute to the inert gas ejection process are omitted, it is desirable that the raw material mist ejection port 3 is provided near the lower end of the mist jet nozzle 1 which is closer to the substrate 100 and near the oxidizing agent supply port 5. Arranging the raw material mist ejection port 3 at a position closer to the substrate 100 can suppress adhering of a reaction product in the raw material mist ejection port 3.

In a case where the configurations 30, 53, 8, and 4 that contribute to the inert gas ejection process are omitted, it is desirable that the raw material mist ejection port 3 is positioned at the same height as the oxidizing agent supply ports 5 with respect to the Z-axis direction or positioned higher than the oxidizing agent supply ports 5 with respect to the Z direction (in FIG. 2, positioned above the oxidizing agent supply ports 5 with respect to the Z direction).

In this embodiment, the ultrasonic atomizer is used to generate the mist of the raw material from the raw material solution.

Atomizing the raw material solution by using the ultrasonic atomizer enables the size of the mist droplet to be set small, so that the falling speed of the ejected mist of the raw material can be sufficiently lowered. Since the size of the mist droplet is small, an oxide film reaction on the substrate is generated quickly. Additionally, an inert gas is not used to atomize the raw material solution. Therefore, the speed of ejection of the mist of the raw material can be adjusted merely by changing the flow rate of the carrier gas. As mentioned above, the carrier gas (inert gas) does not contribute to generation of the mist of the raw material. Therefore, in this embodiment that employs the mist method, supply of a large amount of inert gas is not necessary. Thus, the problems that the droplets scatter on the substrate and the droplets are left unreacted on the substrate are not caused.

Instead of the configuration shown in FIG. 2, any one of the raw material mist ejection port 3, the oxidizing agent supply port 5, and the inert gas ejection port 4 may be placed in a nozzle different from the mist jet nozzle 1, or they may be placed respectively in separate nozzles different from the mist jet nozzle 1. However, in a case where all of the raw material mist ejection port 3, the oxidizing agent supply ports 5, and the inert gas ejection ports 4 are provided in the same mist jet nozzle 1 as shown in FIG. 2, the apparatus for forming an oxide film can be simplified.

Meanwhile, the inventors have found out that positively supplying an oxidizing agent in addition to moisture contained in the atmosphere is necessary based on the effects of the invention described above. However, it is not always true that supplying a larger amount of oxidizing agent is better. To be specific, from the viewpoint of the efficiency of film formation and the quality of the formed oxide film, the amount of supply of the oxidizing agent may be determined in accordance with the type of the alkyl compound included in the raw material solution.

Therefore, in this embodiment, as shown in FIG. 2 (showing a case where the oxidizing agent is in a gas state) and FIG. 3 (showing a case where the oxidizing agent is in a liquid state), the supply adjustment unit 50 configured to adjust the amount of supply of the oxidizing agent is provided. In a case where the supply adjustment unit 50 is provided, a proper amount of oxidizing agent in accordance with the type of the alkyl compound can be always supplied to the mixing region 6*a* of the cavity 6. Therefore, improvement in the efficiency of film formation and formation of a high-quality oxide film are always achieved.

As described above, the oxidizing agent may be either in a liquid or in a gas state. For example, in a case where dew condensation occurs due to the reaction of the mist of the raw material and the oxidizing agent, it is desirable that the oxidizing agent is in a gas state rather than in a liquid state.

The present invention adopts a nozzle method in which the mist of the raw material is ejected toward the substrate by using the mist jet nozzle 1. The nozzle method is suitable for forming a uniform film on a substrate having a large area.

While the invention has been shown and described in detail, the foregoing description is in all aspects illustrative and not restrictive. It is therefore understood that numerous modifications and variations can be devised without departing from the scope of the invention.

DESCRIPTION OF THE REFERENCE NUMERALS

1 mist jet nozzle
1A main body
1H hollow part
2 raw material mist supply port
3 raw material mist ejection port
4 inert gas ejection port
5 oxidizing agent supply port
6 cavity
6*a* mixing region
7 raw material mist passage
8 inert gas passage
9 oxidizing agent passage
10 raw material mist supply passage
20 raw material mist generation chamber
25, 40*a* ultrasonic atomizer
30 inert gas chamber
40 oxidizing agent chamber
50 supply adjustment unit
51, 51*a*, 52, 53, 54 pipe
100 substrate

The invention claimed is:

1. A method for forming an oxide film on a substrate, the method comprising:

(A) forming a raw material mist from a raw material solution comprising an alkyl compound, and ejecting the raw material mist to a substrate in the presence of atmosphere, wherein the alkyl compound is selected from the group consisting of diethyl zinc, dimethyl zinc, dimethyl magnesium, diethyl magnesium, biscyclopentadienyl magnesium, trimethyl aluminum, triethyl aluminum, trimethyl gallium, triethyl gallium, trimethyl indium, triethyl indium, tetramethyl silane, tetraethyl silane, trimethyl silane, triethyl silane, dimethyl silane and diethyl silane;

(B) supplying an oxidizing agent that exerts an oxidizing effect on said alkyl compound to ejected raw material mist in a spotted manner toward the ejected raw material mist, to form an oxide film on the substrate, such that the raw material mist is mixed with the oxidizing agent in a mixing region located at a path through which the raw material mist is ejected and then goes toward an area smaller than an upper surface area of the substrate; and (C) ejecting an inert gas to a surrounding area of the ejected raw material mist, wherein:

the substrate does not include a substrate arranged in a reaction vessel;

a point from which the raw material mist is ejected is a greater distance from the upper surface of the substrate, compared to a point from which the oxidizing agent is supplied to the mixing region; and the ejecting of the inert gas occurs such that the inert gas enters the mixing region at about the same angle as an angle at which the raw material mist enters the mixing region.

2. The method according to claim 1, wherein the ejecting (A) comprises a mist generation process for forming the raw material solution into the raw material mist through an ultrasonic atomizing process.

3. The method according to claim 1, wherein the oxidizing agent is selected from the group consisting of water, oxygen, hydrogen peroxide, ozone, nitric oxide, nitrous oxide, and nitrogen dioxide.

4. The method according to claim 1, wherein the inert gas is either of nitrogen and a rare gas.

5. The method according to claim 1, wherein the supplying (B) is adjusted to a desired amount the oxidizing agent.

6. The method of claim 1, wherein the oxidizing agent is supplied to the mixing region via at least one supply port formed on an inclined surface relative to the angle at which the raw material mist enters the mixing region.

7. An oxide film formation apparatus, comprising:
a raw material mist ejection port configured to eject a misty raw material solution comprising an alkyl compound to a substrate arranged in the atmosphere;
an oxidizing agent supply port configured to supply an oxidizing agent that exerts an oxidizing effect on the alkyl compound in a spotted manner toward the mist of the raw material solution that has been ejected from the raw material mist ejection port; and
an inert gas ejection port arranged neighboring the raw material mist ejection port and configured to eject an inert gas,
wherein:
the substrate does not include a substrate arranged in a reaction vessel;
the mist of the raw material solution is mixed with the oxidizing agent in a mixing region located at a path through which the raw material mist is ejected and then goes toward an area smaller than an upper surface area of the substrate;
a point from which the raw material mist is ejected from the raw material mist ejection port is a greater distance from the upper surface of the substrate, compared to a point from which the oxidizing agent is supplied from the oxidizing agent supply port to the mixing region;
the inert gas ejection port is arranged such that the inert gas enters the mixing region at about the same angle as an angle at which the raw material mist enters the mixing region; and
the alkyl compound is selected from the group consisting of diethyl zinc, dimethyl zinc, dimethyl magnesium, diethyl magnesium, biscyclopentadienyl magnesium, trimethyl aluminum, triethyl aluminum, trimethyl gallium, triethyl gallium, trimethyl indium, triethyl indium, tetramethyl silane, tetraethyl silane, trimethyl silane, triethyl silane, dimethyl silane and diethyl silane.

8. The apparatus according to claim 7, further comprising:
an ultrasonic atomizer configured to form raw material solution into a mist.

9. The apparatus according to claim 7, wherein the raw material mist ejection port, the oxidizing agent supply port, and the inert gas ejection port are formed in the same nozzle.

10. The apparatus according to claim 7, wherein the oxidizing agent is selected from the group consisting of water, oxygen, hydrogen peroxide, ozone, nitric oxide, nitrous oxide, and nitrogen dioxide.

11. The apparatus according to claim 7, wherein the inert gas is either of nitrogen and a rare gas.

12. The apparatus according to claim 7, further comprising:
a supply adjuster configured to adjust an amount of supply of the oxidizing agent.

13. The apparatus of claim 7, wherein the oxidizing agent is supplied to the mixing region via at least one supply port formed on an inclined surface relative to the angle at which the raw material mist enters the mixing region.

* * * * *